(12) United States Patent
Anderson (10) Patent No.: US 8,565,448 B2
(45) Date of Patent: *Oct. 22, 2013

(54) DYNAMIC BASS EQUALIZATION WITH MODIFIED SALLEN-KEY HIGH PASS FILTER

(75) Inventor: Jeffrey S. Anderson, Camas, WA (US)

(73) Assignee: Logitech Europe S.A., Lausanne (CH)

( * ) Notice: Subject to any disclaimer, the term of this patent is extended or adjusted under 35 U.S.C. 154(b) by 1067 days.

This patent is subject to a terminal disclaimer.

(21) Appl. No.: 12/336,238

(22) Filed: Dec. 16, 2008

(65) Prior Publication Data

US 2012/0207328 A1    Aug. 16, 2012

Related U.S. Application Data

(63) Continuation of application No. 09/379,945, filed on Aug. 24, 1999, now Pat. No. 7,466,829.

(51) Int. Cl.
     *H03G 5/00*      (2006.01)

(52) U.S. Cl.
     USPC ............................ 381/103; 381/98; 333/28 R (58) Field of Classification Search
     USPC ..................... 381/98, 100–103; 333/14, 28 R
     See application file for complete search history.

(56) References Cited

U.S. PATENT DOCUMENTS

| | | |
|---|---|---|
| 3,564,445 A | 2/1971 | Brokaw |
| 4,266,094 A | 5/1981 | Abend |
| 4,751,739 A | 6/1988 | Serikawa et al. |
| 4,809,338 A | 2/1989 | House |
| 5,263,087 A | 11/1993 | Fosgate |
| 5,293,087 A | 3/1994 | Hamano et al. |
| 5,305,388 A | 4/1994 | Konno |
| 5,359,665 A | 10/1994 | Werrbach |
| 5,361,381 A | 11/1994 | Short |
| 6,665,408 B1 | 12/2003 | Schott |
| 7,016,509 B1 * | 3/2006 | Bharitkar et al. ............... 381/98 |
| 7,058,188 B1 * | 6/2006 | Allred ........................... 381/107 |
| 7,466,829 B1 | 12/2008 | Anderson |

OTHER PUBLICATIONS

Frank Tedeschi, The Active Filter Handbook, Tab Books Inc., Blue Ridge Summit, Pennsylvania, 1979, 141-149.

* cited by examiner

*Primary Examiner* — Xu Mei (74) *Attorney, Agent, or Firm* — Kilpatrick Townsend & Stockton LLP (57) ABSTRACT

A dynamic bass equalization circuit has an amplitude dependent gain that is dependent upon the audio electrical signal amplitude and a dynamically adjusted frequency response that varies with the amplitude dependent gain. In one implementation, the dynamic bass equalization circuit includes a Sallen-Key high pass filter that includes an amplifier with a negative feedback path. The dynamically adjusted frequency response is provided by a parallel pair of reversed diodes connected in the negative feedback path.

21 Claims, 5 Drawing Sheets

DYNAMIC BASS EQUALIZATION WITH MODIFIED SALLEN-KEY HIGH PASS FILTER

This application is a continuation on of U.S. application Ser. No. 09/379,945 filed Aug. 24, 1999, entitled "Dynamic Bass Equalization With Modified Sallen-Key High Pass Filter", issued as U.S. Pat. No. 7,466,829, which application is incorporated herein by reference for all purposes.

FIELD OF THE INVENTION

The present invention relates to multimedia computer amplified speaker systems and more particularly to a system with a dynamic bass equalization circuit having amplitude dependent gain and a dynamically adjusted frequency response that varies with the amplitude dependent gain.

BACKGROUND AND SUMMARY OF THE INVENTION

Speaker systems with integrated amplification electronics provide simple, compact audio transducers for multimedia personal computers. These speaker systems, referred to herein as multimedia computer amplified speaker systems, typically include pairs of wide-band speaker drivers mounted in separate housings with amplification electronics incorporated into one or both housings. Because compactness is desirable, small, wide-band speaker drivers (e.g., 3-inch diameter cone speaker drivers) are commonly used. Speaker systems of this type can offer acceptable stereo sound quality for some applications, but discerning listeners and demanding applications can require audio performance beyond the capabilities of such systems.

Bass sounds (i.e., sounds of frequencies less than about 150 Hz) are the most difficult for compact wide-band speaker systems to reproduce. The production of satisfactory bass levels is problematic for two reasons. Small speaker drivers have poor bass response because of their small physical size. In addition, the human ear is relatively less sensitive to bass frequencies than higher treble frequencies, particularly at low sound levels or volumes. The transduction of treble frequencies, which are designated herein as frequencies greater than about 150 Hz, does not suffer these difficulties.

In order to provide full, rich bass sound from a relatively small driver in a small enclosure, as in computer multi-media speaker applications, the electronics of the driving circuit are equalized to add a bass boost that compensates for limitations of driver size and enclosure volume. This bass boost can introduce artifacts into the audio signal that is delivered to the driver. For example, with most of the power provided by amplifier circuits typically being directed to bass frequencies, there is typically little capacity for increased volume levels. As a consequence, increasing the volume level will frequently result in amplifier clipping or sound distortion from driver over-excursion.

Past solutions to this problem have been to dynamically adjust the amount of bass boost relative to the desired loudness. As the volume is turned up, the bass boost, or relative bass level, is turned down. This allows the apparent loudness of the speaker system to increase without increasing undesired distortion levels. Typical circuit topologies to provide these dynamic adjustments generally fall into two classes: amplitude controlled variable resistance circuits and amplitude compressors/soft clippers. Both circuit types suffer from disadvantages.

Amplitude controlled variable resistance circuits suffer from associated attack and decay time delays during which bass boost adjustments are incomplete, resulting in discernible audio artifacts until the adjustments are completed. In addition, these types of circuits can introduce discernible distortion into the resulting audio signal. Amplitude compressors/soft clippers provide no control over frequency response. The general frequency response is largely unaffected by the compressing action. The fundamental frequencies are passed through to the amplifier, and the low frequencies can cause over-excursion in the driver.

Examples of prior dynamic equalization systems are illustrated by U.S. Pat. No. 5,359,665 of Werrbach and U.S. Pat. No. 5,361,381 of Short. Both of these systems employ control signals that are generated by an active circuit component to control signal compression or equalization. The generation of such control signals is delayed with respect to the signal being controlled, thereby introducing attack and decay time delays during signal compression or equalization. These attack and decay time delays result in discernible audio artifacts until the adjustments are completed.

Accordingly, a dynamic bass equalization circuit of the present invention has an amplitude dependent gain that is dependent upon the audio electrical signal amplitude and a dynamically adjusted frequency response that varies with the amplitude dependent gain. In one implementation, the dynamic bass equalization circuit includes a Sallen-Key high pass filter that includes an amplifier with a real-time negative feedback path. The dynamically adjusted frequency response is provided by a parallel pair of reversed diodes that are connected in the negative feedback path.

A dynamic bass equalization circuit according to the present invention operates without the attack or decay times that are characteristic of prior amplitude controlled variable resistance bass equalization circuits and equalization circuits employing active circuitry for generating control signals. In addition, the bass equalization circuit of this invention has amplitude dependent gain and frequency response modification that are not available in prior amplitude compressors/soft clipper bass equalization circuits. As a result, the present invention provides dynamic bass boost without the acoustic artifacts characteristic of attack or decay times or the over-excursion of speaker drivers that can occur with equalizers having fixed frequency characteristics.

Additional objects and advantages of the present invention will be apparent from the detailed description of the preferred embodiment thereof, which proceeds with reference to the accompanying drawings.

DETAILED DESCRIPTION OF PREFERRED EMBODIMENTS

Figure 1:
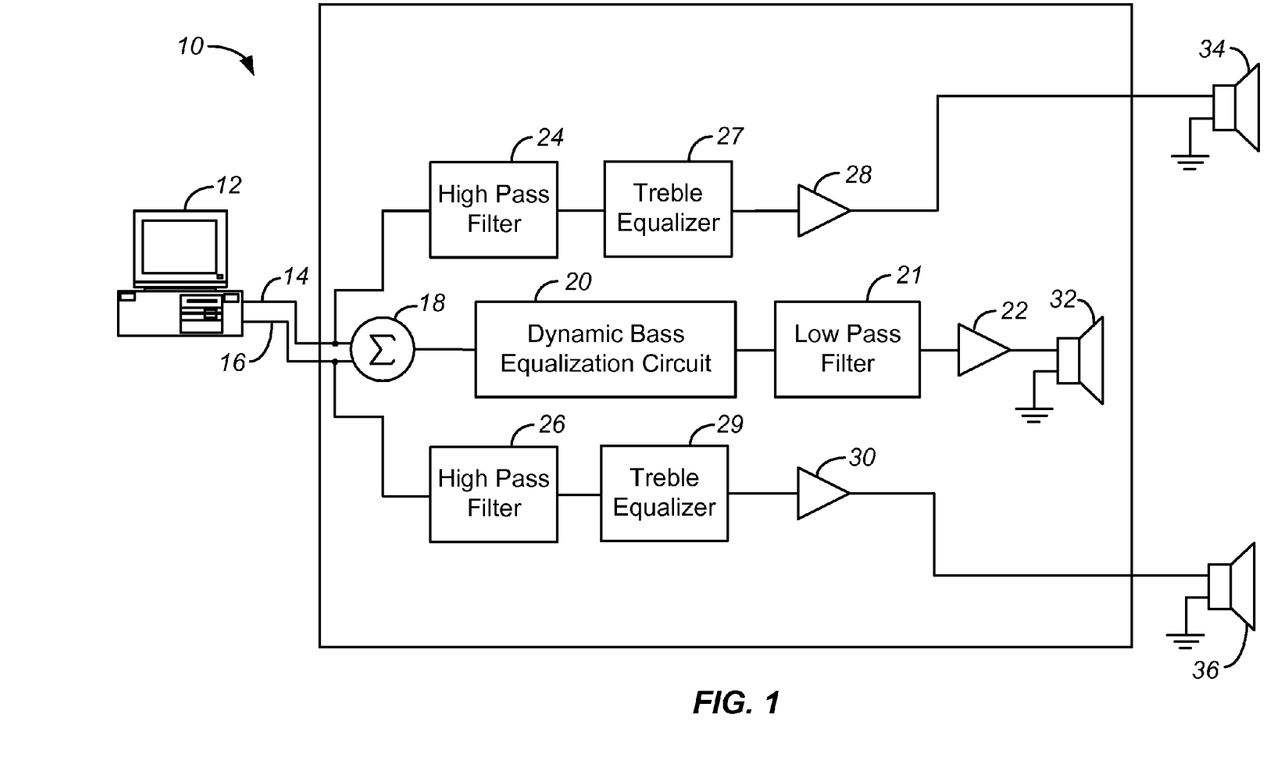
FIG. 1 is a block diagram of a multimedia computer stereophonic amplified speaker system with treble and bass speaker drivers.

FIG. 1 is a block diagram of a stereophonic amplified speaker system 10 that receives at respective inputs 14 and 16 audio electrical signals corresponding to left and right channels of a stereophonic audio electrical signal provided by a multimedia computer 12. The audio electrical signals received at inputs 14 and 16 are added together or mixed by an analog adder circuit 18.

A dynamic bass equalization circuit 20 with amplitude dependent gain and frequency response dynamically enhances or boosts the bass portion audio signal by an amount dependent on the magnitude of the audio electrical signal. The bass portion is boosted proportionally more for lower magnitude sound levels. In the present implementation, bass equalization circuit 20 operates as an active amplifier circuit that enhances the bass portion relative to the treble portion. A low-pass filter block 21 filters the audio signal from bass equalization circuit 20, blocking treble frequencies while permitting the boosted bass frequencies of the signal to pass to a bass amplifier 22.

The left and right stereophonic audio electrical signals continue on to respective high-pass filter blocks 24 and 26, which block bass frequencies while permitting treble frequencies of the left and right channel audio signals to pass to treble portion equalizers 27 and 29 and buffer amplifiers 28 and 30, respectively. Sub-woofer 32 and satellite treble-band speakers 34 and 36 receive corresponding audio signals from respective amplifiers 22, 28, and 30 to transduce the signals into sound. Speaker system 10 also includes at least one volume control (not shown) for controlling the volume of sound generated by system 10.

Figure 2:
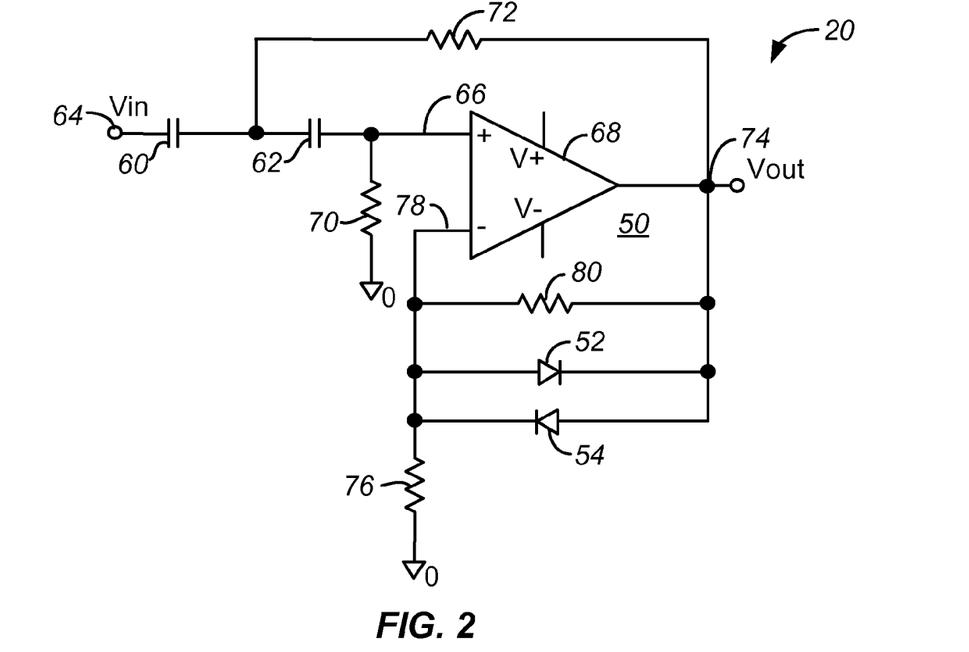
FIG. 2 is a circuit schematic diagram of a first embodiment of a dynamic bass equalization circuit with amplitude dependent gain and frequency response modification according to the present invention.

FIG. 2 is a circuit schematic diagram of a dynamic bass equalization circuit 20 with amplitude dependent gain and frequency response modification according to the present invention. In this implementation, dynamic bass equalization circuit 20 includes a second order Sallen-Key high pass filter 50, which is also referred to as a voltage controlled voltage source high pass filter, with a parallel pair of reversed diodes 52 and 54 coupled across a real-time negative feedback path. As is known in the art, a second order filter provides frequency dependent filtering at about −12 dB/octave.

Sallen-Key high pass filter 50 is an active filter circuit in which controlling the amplitude voltage across an element will beneficially change the frequency response, Q, or gain of the circuit according to the present invention. Dynamic bass equalization circuit 20 could alternatively include in substitution of Sallen-Key high pass filter 50 any active filter circuit in which controlling the amplitude voltage across an element will change the frequency response, Q, or gain of the circuit, as described below in greater detail.

Sallen-Key high pass filter 50 includes a pair of series connected capacitors 60 and 62 coupled between an equalization circuit input 64 and a positive input 66 of an amplifier 68. A resistor 70 is connected between positive input 66 and ground. A resistor 72 is coupled as a positive feedback path between output 74 and a junction between capacitors 60 and 62. A resistor 76 is connected between ground and a negative input 78 of amplifier 68. A resistor 80 is connected in parallel with reversed diodes 52 and 54 between output 74 and negative input 78 to provide filter 50 with real-time AC negative feedback.

The small signal gain K and quality factor Q characteristics of Sallen-Key high pass filter 50 are represented as:

$$K := 1 + \frac{RF}{R1}$$
$$Q := \frac{1}{3 - K}$$

wherein R1 and RF represent the resistances of resistors 72 and 80, respectively, and Q represents a measure of frequency response modification in terms of the sharpness of the peak gain at a resonant frequency. With increased output voltages, the voltage across resistor 80 will also increase and current will be conducted across diodes 50 and 52, thereby reducing the net impedance between output 74 and negative input 78. A reduction in the gain K will also reduce the quality factor Q of the circuit, thereby providing dynamic frequency response modification.

In one implementation, bass equalization circuit 20 is configured to have a maximum or peak gain at a low frequency value and then to radically roll-off the signal at frequencies below that peak value. This can be achieved with, for example, a quality factor Q greater than 0.707 (i.e., gain K greater than 1.58). With small-signal inputs, bass equalization circuit 20 operates according to the above equations. As the input signal level increases, diodes 50 and 52 begin to reduce the overall gain of equalization circuit 20, as well as reducing its peak gain. The gain becomes asymptotic to unity, and the quality factor Q becomes asymptotic to 0.5. The result is a sub-woofer signal that reduces in level and reduces in peaking as the signal input increases in amplitude.

Figure 3:
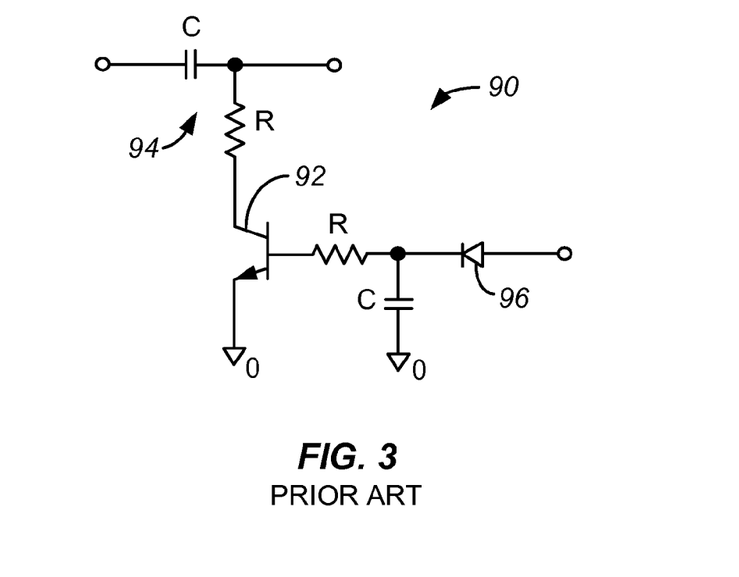
FIG. 3 is a circuit schematic diagram of a prior art amplitude controlled variable resistance bass equalization circuit.

FIG. 3 is a circuit schematic diagram of a prior art amplitude controlled variable resistance bass equalization circuit 90 having a transistor 92 that is operated in the resistance region of operation. Operation of circuit 90 can be described with reference to its two extremes of operation: transistor 92 being fully ON or fully OFF. With transistor 92 fully ON, circuit 90 operates as a first order high-pass filter with a characteristic frequency $f_0$ (−3 dB) of $(2\pi RC)^{-1}$. With transistor 92 fully OFF, there is no high-pass filter operation by circuit 90 and hence no frequency modification. Between the fully ON and OFF states of transistor 92, circuit 90 operates according to the relative proportions of the ON and OFF states. Circuit 90 suffers from attack and decay time delays due to the filtering and rectification by a diode 96. The attack and decay times can delay bass boost compensation, thereby introducing discernible audio artifacts.

Figure 4:
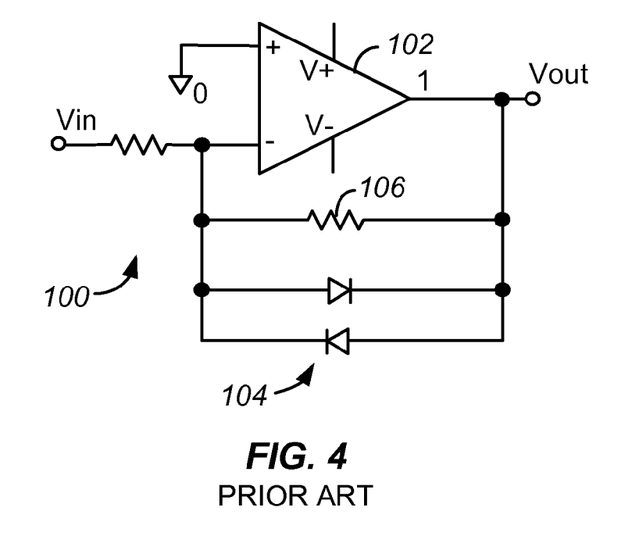
FIG. 4 is a circuit schematic diagram of a prior art amplitude compressors/soft clipper.

FIG. 4 is a circuit schematic diagram of a prior art amplitude compressors/soft clipper circuit 100 having a voltage amplifier circuit 102 with a parallel pair of opposing diodes 104 in the negative feed-back path. At low input signal levels, diodes 104 are off and the circuit amplifies the signal in the usual manner. As the input signal increases, diodes 104 begin to conduct, logarithmically limiting the voltage across a feedback resistor 106 and reducing the gain of circuit 100 and clamping the maximum voltage to a peak-to-peak value equal to the forward voltage of diodes 104.

Circuit 100 can effectively control the amplitude of the audio output signal and "soft-clip" it before the power-amplifiers "hard-clip". This topology has advantages over amplitude controlled circuits (e.g., circuit 90) in that it has no attack and decay times associated with its operation. It also can be more linear because it avoids transistor biasing problems. A primary disadvantage of circuit 100 is that there is no control over frequency response. The general frequency response is largely unaffected by the compressing action. The fundamental frequencies are passed through to the amplifier, and can allow the bass frequencies to cause over-excursion in the driver.

Dynamic bass equalization circuit 20 operates without the attack or decay times that are characteristic of prior amplitude controlled variable resistance bass equalization circuits (e.g., circuit 90). In addition, bass equalization circuit 20 has amplitude dependent gain and frequency response modification that are not available in prior amplitude compressors/soft clipper bass equalization circuit (e.g., circuit 100). Hence, dynamic bass equalization circuit 20 eliminates distortion and audio artifacts characteristic of prior bass equalization circuits. Moreover, the distortion properties of bass equalization circuit 20 are symmetrical, and thus harmonic in nature. For sub-woofer circuits, the use of any high order low pass filter after bass equalization circuit 20 can reduce the harmonics to inaudible levels.

Figure 5:
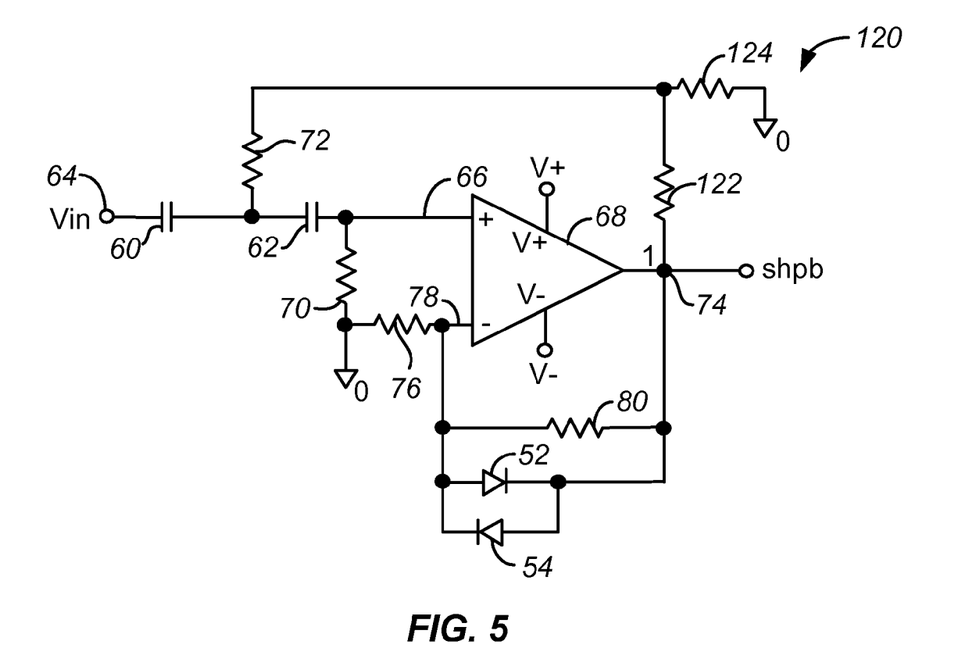
FIG. 5 is a circuit schematic diagram of a second embodiment of a dynamic bass equalization circuit with amplitude dependent gain and frequency response modification according to the present invention.

FIG. 5 is a circuit schematic diagram of another dynamic bass equalization circuit 120 with amplitude dependent gain and frequency response modification according to the present invention. Bass equalization circuits 20 and 120 are substantially the same, with like components identified by like reference numerals, except that circuit 120 includes resistors 122 and 124 in the positive feedback path. Resistors 122 and 124 function as a voltage divider that reduces circuit sensitivity to component values and deviations. As a result of resistors 122 and 124, the remaining circuit components would have values designed for the voltage divided gains.

In one exemplary implementation, amplifier 68 is of type TL072/301/TI and diodes 52 and 54 are of type 1N4148. Capacitors 60 and 62 each have a capacitance of 47 nF. Resistors 70, 72, 76, and 80 have resistances of 91 k-ohms, 68 k-ohms, 10 k-ohms, 91 k-ohms, respectively. Voltage divider resistors 122 and 124 have resistances of 62 k-ohms and 16 k-ohms, respectively.

Based upon the Sallen-Key key equations, circuit 120 without diodes 52 and 54 has a designed gain of 20 dB, a Q-factor of 1.2, and a frequency roll-off at 40 Hz. At the Q point of the circuit, or the point of maximum gain, the gain is approximately 22.5 dB. The non-peaked pass-band gain is 20 dB.

Equalization circuit 120 will have a theoretical pass-band compression near 20 dB because as the input voltage increases, the forward voltage across diodes 52 and 54 becomes very small and causes the net feedback impedance to be very small, and the gain will become asymptotic to unity. Although this circuit has maximum compression, the THD or Total Harmonic Distortion is also high. (Total Harmonic Distortion is a measure of the amount a circuit distorts a sinusoidal signal applied to the circuit of the resultant signal.) This high THD arises because diodes 52 and 54 function as voltage clamps. At small signals, diodes 52 and 54 do not conduct, and variations in the waveform are very linear. However, as the peak of the waveform increases, diodes 52 and 54 begin conducting and reducing the gain of the circuit for only part of the waveform, thereby causing non-linear deformation. The distortion is harmonic in nature and can be filtered out with the use of a low-pass filter stage.

Figure 6:
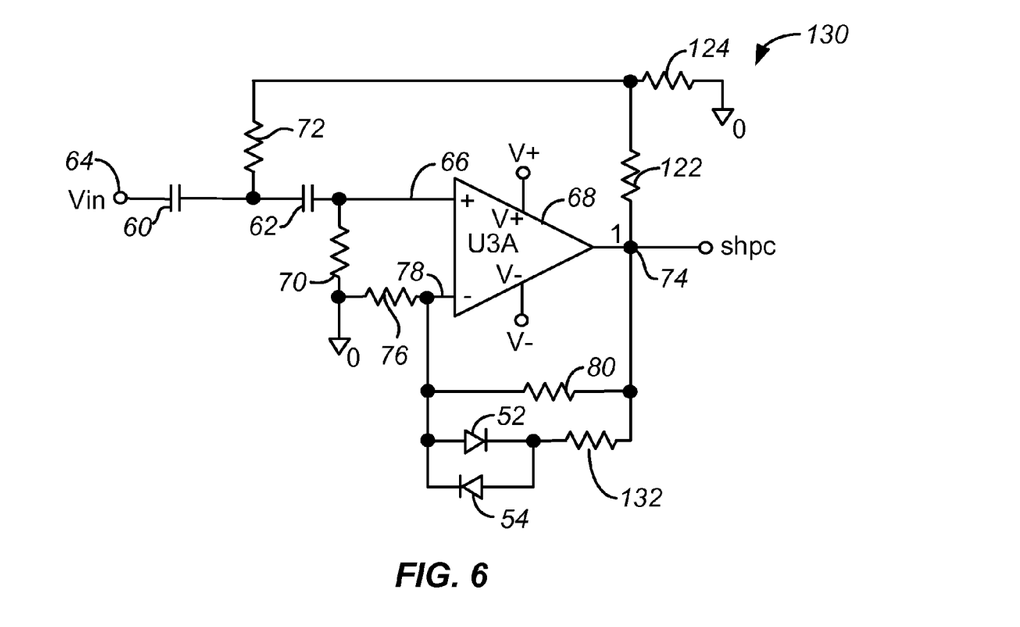
FIG. 6 is a circuit schematic diagram of a third embodiment of a dynamic bass equalization circuit with amplitude dependent gain and frequency response modification according to the present invention.

FIG. 6 is a circuit schematic diagram of another dynamic bass equalization circuit 130 with amplitude dependent gain and frequency response modification according to the present invention. Bass equalization circuits 120 and 130 are substantially the same, with like components identified by like reference numerals, except that circuit 130 includes a resistor 132 connected in series with diodes 52 and 54 in the negative feedback path.

With high amplitude input signals, the forward voltage across diodes 52 and 54 is small in comparison to the voltage across resistor 80. When diodes 52 and 54 are fully on, series resistor 132 is essentially in parallel with resistor 80. Although it reduces the total compression and frequency modification, series resistor 132 reduces the amount of total harmonic distortion (THD) because the nonlinear diode forward voltage is a small fraction of the overall feedback path voltage drop. In an implementation with resistors each having a resistance of 91 k-ohms, the net gain will be roughly half. In practice, the gain has a factor of 1+ that needs to be accounted for, and the diode forward voltage has the net effect of increasing the impedance in the parallel leg, thus the total amount of compression is closer to about 5.5 dB. This implementation has much less distortion than the previous example, at the expense of less compression. The lower THD is result of the fact that when diodes 52 and 54 are conducting, the linear circuit element (i.e., series resistor 132) is conducting in the normal linear fashion. The diode forward voltage is much smaller than the voltage across series resistor 132 during most of the waveform, thus it's non-linear effects are minimized.

Simulation and testing of circuits 120 and 130 showed that both the gain and quality factor Q of the circuits were being modified by diodes 52 and 54. Simulation and testing was also performed with respect to a circuit 120 with diodes. At 10 mv input, circuits 120 and 130 and circuit 120 without diodes performed almost identically. They all had a frequency response plot that coincided with the mathematically predicted results of the standard Sallen-Key filter.

At 100 mv input, the circuit 120 with no diodes performed mathematically. Circuit 120 at 100 mv input has a measured peak amplitude gain of 12.9 dB at 100 Hz and 11.7 dB at 40 Hz for compression values of 7.2 dB and 10.8 dB respectively. At 1.0 volts input, the gain was 1.8 dB at 100 Hz and −1.4 dB at 40 Hz for compression values of 18.3 dB and 23.9 dB respectively. Circuit 130 had a peak amplitude gain of 17.1 dB at 100 Hz and 15.5 dB at 40 Hz. This is a resultant compression of about 3 dB and 7 dB at 100 Hz and 40 Hz respectively. If the Q were not being modified, the two compression values would be the same. At 1.0 volt input, the gain of circuit 130 is reduced to 14.6 dB at 100 Hz and 11.2 dB at 40 Hz for compression values of about 5.5 dB and 11.3 dB, respectively.

Figure 7:
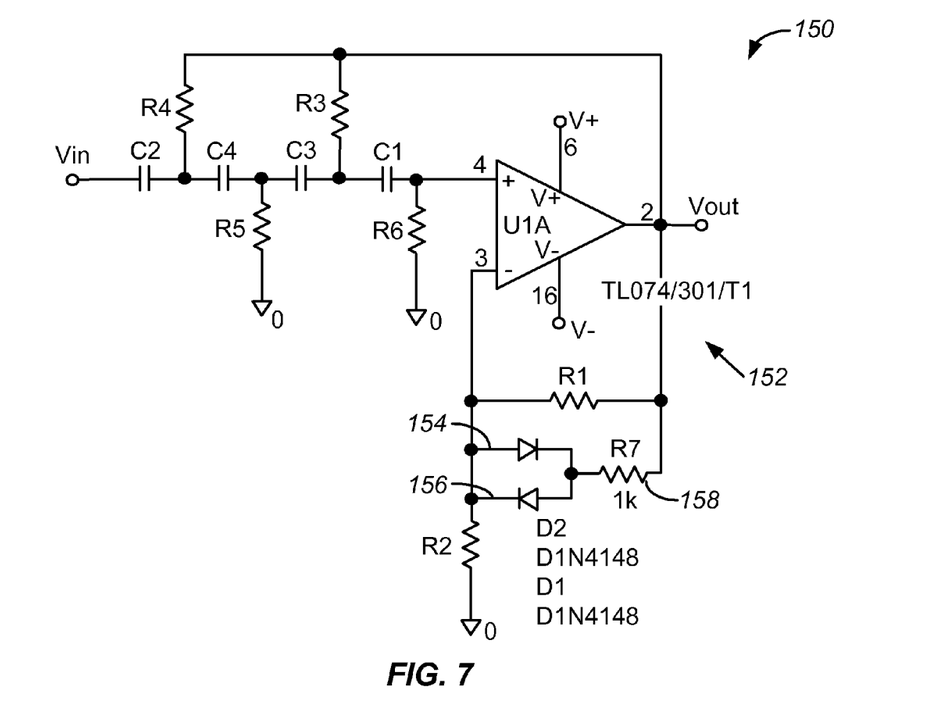
FIG. 7 is a circuit schematic diagram of a dynamic bass equalization circuit with a fourth order Sallen-Key high pass filter and providing amplitude dependent gain and frequency response modification according to the present invention.

FIG. 7 is a circuit schematic diagram of another dynamic bass equalization circuit 150 with amplitude dependent gain and frequency response modification according to the present invention. Bass equalization circuit 150 includes a fourth order Sallen-Key high pass filter 152, which is also referred to as a voltage controlled voltage source high pass filter, with a parallel pair of reversed diodes 154 and 156 coupled in series with a resistor 158 across a negative feedback path. As is known in the art, a fourth order filter provides frequency dependent filtering at about −24 dB/octave.

Sallen-Key high pass filter 152 is an active filter circuit in which controlling the amplitude voltage across an element will beneficially change the frequency response, Q, or gain of the circuit according to the present invention. Fourth order Sallen-Key high pass filter 152 operates in a manner very similar to that of the 2nd order Sallen-Key circuits described with reference to bass equalization circuits 20, 120, and 130. Dynamic bass equalization circuit 150 illustrates yet another active filter circuit 152 in which controlling the amplitude voltage across an element will change the frequency response, Q, or gain of the circuit.

Figure 8:
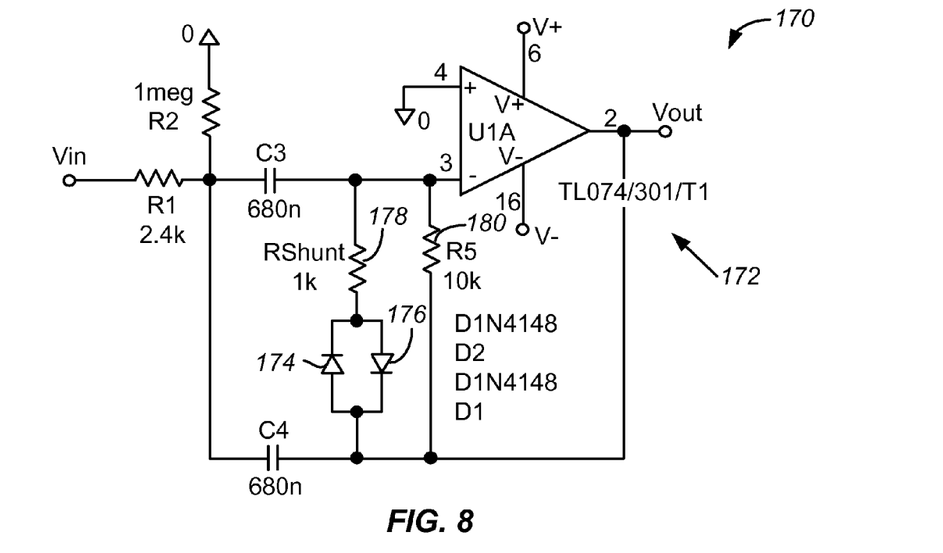
FIG. 8 is a circuit schematic diagram of a dynamic bass equalization circuit with a multiple feedback band-pass filter and providing amplitude dependent gain and frequency response modification according to the present invention.

FIG. 8 is a circuit schematic diagram of another dynamic bass equalization circuit 170 with amplitude dependent gain and frequency response modification according to the present invention. Bass equalization circuit 170 includes a multiple feedback band-pass filter 172 that includes a parallel pair of reversed diodes 174 and 176 coupled in series with a resistor 178 across a negative feedback path. Multiple feedback band-pass filter 172 is an active filter circuit in which controlling the amplitude voltage across an element will beneficially change the frequency response, Q, or gain of the circuit according to the present invention.

In the implementation illustrated in FIG. 8, bass equalization circuit 170 has a gain of 6 db and a Q of 1.0 at a center frequency of 50 Hz. At low amplitude levels, diodes 174 and 176 are off and multiple feedback band-pass filter 172 operates in its conventional manner. At large amplitude levels, diodes 174 and 176 conduct placing the resistor in parallel 178 with a feedback resistor 180. The Q and gain reduce asymptotically to 0.3 and −14 dB, respectively, and the center frequency increases to 150 Hz.

Figure 9:
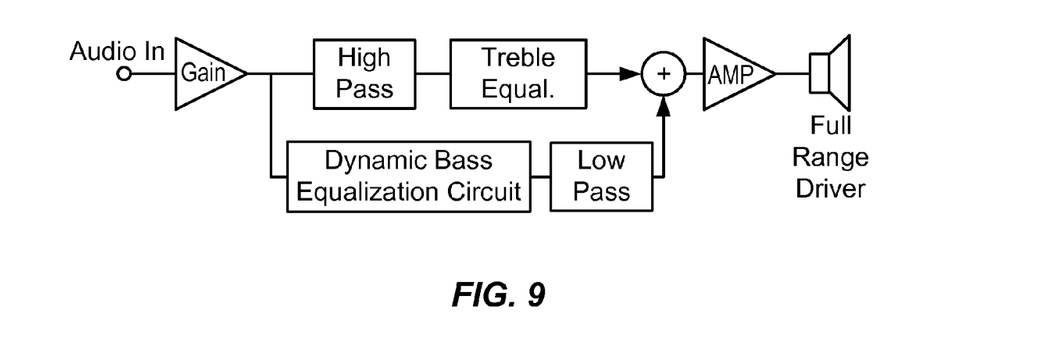
FIG. 9 is a block diagram of a multimedia computer stereophonic amplified speaker system with full-range speaker drivers.

In addition to multimedia computer systems with subwoofer drivers as shown in FIG. 1, it will be appreciated that dynamic bass equalization circuits according to the present invention may be also be applied to with full range drivers. FIG. 9 is a block diagram of one stereo channel of such an implementation.

It will also be appreciated that more powerful amplitude and Q compression can be attained by using Unequal-Value Sallen-Key circuits. Because all of the Sallen-Key forms are of the non-inverting KRC class, the gain K will always be asymptotic to unity. Thus an Unequal-Value Sallen-Key circuit designed for a gain of 20 dB will have compression that, in theory, will be 20 dB. For Unequal-Value circuits, the Q compression is asymptotic, but the absolute value is dependent on the other circuit values. This type of dynamic compression can be applied to other active filter topologies as well.

In view of the many possible embodiments to which the principles of our invention may be applied, it should be recognized that the detailed embodiments are illustrative only and should not be taken as limiting the scope of our invention. Rather, the invention includes all such embodiments as may come within the scope and spirit of the following claims and equivalents thereto.

The invention claimed is:

1. An improved speaker system having a speaker driver for transducing into sound an audio electrical signal that has an amplitude, comprising:
a dynamic bass equalization circuit with a second or higher order active filter having automatic dynamically adjusted gain and frequency response that vary with the amplitude of the audio electrical signal,
the active filter including an amplifier with a feedback path which reduces a gain of said amplifier as said amplitude of said audio electrical signal increases such that a gain of a bass sound is reduced;
the dynamic bass equalization circuit further comprising a parallel pair of reversed diodes that are connected in the feedback path; and
a resistor connected in the feedback path, the resistor connected in parallel with the parallel pair of reversed diodes.

2. The speaker system of claim 1 in which the active filter includes a Sallen-Key high pass filter.

3. The speaker system of claim 1 in which the dynamically adjusted gain and frequency response are provided by the parallel pair of reversed diodes.

4. The speaker of claim 1 in which the amplifier includes an output and the feedback path includes the resistor connected in series with the parallel pair of opposed diodes and the amplifier output.

5. The speaker system of claim 1 in which the amplifier includes a positive feedback path having a voltage divider that voltage divides a feedback voltage.

6. The speaker of system claim 5 in which the amplifier includes an output and the feedback path includes a resistor connected in series with the parallel pair of opposed diodes and the amplifier output.

7. The speaker system of claim 1 in which the active filter includes an amplifier with a positive feedback path having a voltage divider that voltage divides a feedback voltage.

8. The speaker system of claim 1 in which the dynamic bass equalization circuit provides a bass equalized audio signal that is delivered to a sub-woofer speaker driver.

9. The speaker system of claim 1 in which the dynamic bass equalization circuit provides a bass equalized audio signal that is delivered to a full-range speaker driver.

10. The speaker system of claim 1 wherein the feedback path is a negative feedback path.

11. An improved speaker configured to receive an audio electrical signal that has an amplitude, comprising:
a speaker housing;
an electrical signal input;
at least one treble band speaker;
a sub-woofer speaker;
a dynamic bass equalization circuit coupled between said electrical signal input and said sub-woofer speaker;
said dynamic bass equalization circuit with a second or higher order Sallen-Key high pass filter having automatic dynamically adjusted gain and frequency response that vary with the amplitude of the audio electrical signal,
the filter including
an amplifier and
a feedback path that includes a parallel pair of opposed diodes which reduce a gain of said amplifier as said amplitude of said audio electrical signal increases and
a resistor connected in parallel with the parallel pair of opposed diodes.

12. The speaker of claim 11 in which the amplifier includes an output and the feedback path includes the resistor connected in series with the parallel pair of opposed diodes and the amplifier output.

13. The speaker of claim 11 in which the amplifier includes a positive feedback path having a voltage divider that voltage divides a feedback voltage.

14. The speaker of claim 13 in which the amplifier includes an output and the feedback path includes the resistor connected in series with the parallel pair of opposed diodes and the amplifier output.

15. The speaker of claim 11 in which the active filter includes an amplifier with a positive feedback path having a voltage divider that voltage divides a feedback voltage.

16. The speaker of claim 11 in which the dynamic bass equalization circuit provides a bass equalized audio signal that is delivered to a sub-woofer speaker driver.

17. The speaker of claim 11 in which the dynamic bass equalization circuit provides a bass equalized audio signal that is delivered to a full-rage speaker driver.

18. The speaker of claim 11 wherein the feedback path is a negative feedback path.

19. An improved speaker system having a speaker driver for transducing into sound an audio electrical signal that has an amplitude, comprising:
   a dynamic bass equalization circuit with a second or higher order active filter having automatic dynamically adjusted gain and frequency response that vary with the amplitude of the audio electrical signal;
   the dynamic bass equalization circuit further comprising a resistor connected in parallel with a real-time voltage dependent impedance element,
   wherein the real-time voltage dependent impedance element reduces impedance as voltage increases across the resistor.

20. The speaker system of claim 19 further comprising:
   the dynamic bass equalization circuit further comprising a parallel pair of reversed diodes that are connected in a feedback path; and
   a resistor connected in the feedback path, the resistor connected in parallel with the parallel pair of reversed diodes.

21. The speaker of claim 20 wherein the feedback path is a negative feedback path.

* * * * *